United States Patent
Campbell et al.

(10) Patent No.: US 9,201,524 B2
(45) Date of Patent: Dec. 1, 2015

(54) LENSLESS OPTICAL NAVIGATION DEVICE FOR DIRECTING RADIATION VIA REFLECTION BY THREE TOTAL INTERNAL SURFACES

(75) Inventors: Colin Campbell, Strathaven (GB); Hazel McInnes, Dunfermline (GB); Ewan Findlay, Dollar (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 116 days.

(21) Appl. No.: 14/126,153

(22) PCT Filed: Apr. 12, 2012

(86) PCT No.: PCT/GB2012/050796
§ 371 (c)(1),
(2), (4) Date: Dec. 13, 2013

(87) PCT Pub. No.: WO2012/172302
PCT Pub. Date: Dec. 20, 2012

(65) Prior Publication Data
US 2014/0110564 A1 Apr. 24, 2014

(30) Foreign Application Priority Data
Jun. 16, 2011 (GB) .................................. 1110218.3

(51) Int. Cl.
*G06M 7/00* (2006.01)
*G06F 3/0354* (2013.01)
*G06F 3/042* (2006.01)
*H01L 25/16* (2006.01)

(52) U.S. Cl.
CPC .......... *G06F 3/03547* (2013.01); *G06F 3/0421* (2013.01); *H01L 25/167* (2013.01); *H01L 2924/0002* (2013.01)

(58) Field of Classification Search
CPC ........................... G06F 3/03547; G06F 3/0421
USPC ........................... 250/221, 216; 345/166, 175
See application file for complete search history.

(56) References Cited

U.S. PATENT DOCUMENTS

| | | |
|---|---|---|
| 2001/0050765 A1 | 12/2001 | Antonelli et al. |
| 2004/0164953 A1 | 8/2004 | Keranen et al. |
| 2007/0013679 A1 | 1/2007 | Gruhlke |
| 2008/0218769 A1 | 9/2008 | Ahn et al. |
| 2010/0078545 A1* | 4/2010 | Leong et al. ............. 250/221 |
| 2010/0079408 A1 | 4/2010 | Leong et al. |
| 2010/0302159 A1 | 12/2010 | Findlay et al. |
| 2010/0302160 A1* | 12/2010 | Reigneau ................. 345/166 |

* cited by examiner

*Primary Examiner* — Thanh Luu
(74) *Attorney, Agent, or Firm* — Seed IP Law Group PLLC

(57) ABSTRACT

An optical navigation device for use with mobile telephones and the like is disclosed, which has a reduced height as compared with current designs. The navigation device comprises a laser such as a VCSEL laser, an exposed user surface and two other surfaces that provide for total internal reflection of the incident laser beam. The surfaces are constructed with shallower than normal angles, preserving the basic functionality of the device while reducing the height.

19 Claims, 10 Drawing Sheets

LENSLESS OPTICAL NAVIGATION DEVICE FOR DIRECTING RADIATION VIA REFLECTION BY THREE TOTAL INTERNAL SURFACES

BACKGROUND

1. Technical Field

The disclosure relates to an optical navigation device, a method of manufacturing an optical navigation device, a mobile communications device comprising an optical navigation device and a method of operating an optical navigation device.

2. Description of the Related Art

Current mobile or computer devices use a variety of different navigation mechanisms including trackball devices, multi-click joysticks and capacitance based touch areas. However, there are problems associated with each of these. Trackballs and joysticks can be unreliable and relatively expensive to implement. In addition, capacitance based touch areas do not operate satisfactorily if the finger is covered, for example by a glove, and their size can be large in relation to devices such as mobile phones and PDAs.

Optical navigation devices are also known which operate on the same principals as optical mice by comparing successive frames of an area image. However, conventional devices use LED light sources which require collimation and imaging optics which contribute to the thickness of the devices.

There is therefore a need to provide an optical navigation device which has a reduced thickness compared to existing devices and which operates in a safe manner. In addition, it is desirable that such a device can be manufactured in a simple manner and with a low part count at a suitable cost.

BRIEF SUMMARY

A first aspect of the disclosure provides an optical navigation device comprising: a laser having a principal optical axis; an image sensor having an imaging surface; and an optical element having an exposed user surface, a first total internal reflection (TIR) surface, and a second TIR surface on the underside of the exposed user surface, wherein the optical element, laser and image sensor are together arranged to direct radiation emitted by the laser onto the imaging surface at least partly by total internal reflection by the first and second TIR surfaces, and wherein an angle between the principal optical axis of the laser and the first TIR surface is above 30° and below 40°.

It will be understood that, when a user touches the exposed user surface with an object (e.g., a human digit or a stylus), total internal reflection at the second TIR surface may be frustrated, leading to a pattern being formed on the imaging surface. Scrolling user inputs can be derived from sequential image patterns formed on the imaging surface in this way.

The inventors have realized that an angle of above 30° and below 40° between the principal optical axis of the laser and the first TIR surface is particularly advantageous. This is because, at angles within this range, the second TIR surface can be illuminated to a sufficient degree that a reliable user input can be derived at the imaging surface from frustrated TIR at the exposed user surface. In addition, a relatively low device height can be achieved (e.g., 5 mm or below), using an off-the-shelf (and therefore relatively inexpensive) laser diode and an optical element having a refractive index which can be manufactured with readily available, inexpensive materials (such as polycarbonate or poly-methyl-methacrylate). It will be understood that relatively low device heights are particularly advantageous for optical navigation devices used in, for example, mobile communications devices where miniaturization is a key design driver. In addition, reflective coatings need not be applied to the first or second TIR surfaces to make them reflective, since the principles of TIR can be employed at these angles (i.e., the laser light is totally internally reflected by the first and second TIR surfaces, so they do not need to be coated with reflective materials such as aluminum/silver). This makes manufacture of the device faster, simpler and less expensive.

It will be understood that the principal optical axis of the laser and the first TIR surface typically intersect. Typically, the angle between the principal optical axis of the laser and the first TIR surface referred to above is the angle between them where they intersect.

Typically, the optical navigation device according to the first aspect of the disclosure further comprises a third TIR surface, the optical element, laser and image sensor being together arranged to direct radiation emitted by the laser onto the imaging surface at least partly by total internal reflection by the first, second and third TIR surfaces. By providing a third TIR surface, the image sensor can be positioned on the same (or parallel) plane to the laser which facilitates a more compact design. In addition, by making the third surface a TIR surface, it is not necessary to coat the third surface with a reflective coating, making manufacture of the device faster, simpler and less expensive.

Where a third TIR surface is provided, it is preferable that an angle between a principal optical axis of the image sensor (i.e., the center of the field of view of the image sensor) and the third TIR surface is above 30° and below 40°. In this case, the image sensor is typically mounted on a parallel plane to (or the same plane as) the laser. This allows the optical element to be substantially symmetrical, which can make manufacture of the optical element and assembly of the optical navigation device easier.

It will be understood that the principal optical axis of the image sensor and the third TIR surface typically intersect. Typically, the angle between the principal optical axis of the image sensor and the third TIR surface referred to above is the angle between them where they intersect.

In a preferred embodiment, the angle between the first TIR surface and the principal optical axis of the laser is between 32.5° and 37.5°. The inventors have found that angles in this sub-range provide a number of preferred embodiments. For example, in one such preferred embodiment, it is possible to capture four or more finger print ridge periods on the exposed user surface of the optical navigation device when the device has a height of 5 mm, which has been found to be optimal in some circumstances.

Where the angle between the first TIR surface and the principal optical axis of the laser is provided in this range, and where the optical navigation device comprises a third TIR surface, it is preferable that the angle between the principal optical axis of the image sensor and the third TIR surface is also between 32.5° and 37.5°.

More preferably, the angle between the first TIR surface and the principal optical axis of the laser is between 35° and 36°. The inventors have found that angles in this sub-range provide a number of preferred embodiments. For example, in one such preferred embodiment, it is possible to capture five finger print ridge periods on the exposed user surface of the optical navigation device when the device has a height of 5 mm, which has been found to be optimal in some circumstances. In this case, and where the optical navigation device comprises a third TIR surface, the angle between the principal optical axis of the image sensor and the third TIR surface may also be between 35° and 36°.

In yet another preferred embodiment, the angle between the first TIR surface and the principal optical axis of the laser is between 31° and 36°. The inventors have found that angles in this sub-range provide a number of preferred embodiments. For example, in one such preferred embodiment, it is possible to capture more than two finger print ridge periods on the exposed user surface of the optical navigation device when the device has a height of 3 mm or above. In this case, and where the optical navigation device comprises a third TIR surface, the angle between the principal optical axis of the image sensor and the third TIR surface may also be between 31° and 36°.

In yet another preferred embodiment, the angle between the first TIR surface and the principal optical axis of the laser is between 31.5° and 32.8°. The inventors have found that angles in this sub-range provide a number of preferred embodiments. For example, in one such preferred embodiment, it is possible to capture more than three finger print ridge periods on the exposed user surface of the optical navigation device when the device has a height of 4 mm or above. In this case, and where the optical navigation device comprises a third TIR surface, the angle between the principal optical axis of the image sensor and the third TIR surface may also be between 31.5° and 32.8.

Typically, the optical element comprises a material having a refractive index of between 1.4 and 1.65. More preferably, the optical element comprises a material having a refractive index of between 1.57 and 1.63. In an alternative preferred embodiment, the optical element may comprise a material having a refractive index of between 1.47 and 1.53. Choosing refractive indices in any of these ranges enables readily available, inexpensive materials to be used for the optical element, while keeping the refractive index sufficiently high to provide an exposed user surface of sufficient size for most applications.

For example, the optical element may comprise polycarbonate or poly-methyl-methacrylate (PMMA).

The first and/or second TIR surfaces are typically internal surfaces of the optical element (i.e., surfaces internal to the optical element). Additionally or alternatively, where the optical element comprises a third TIR surface, said third TIR surface may be an internal surface of the optical element.

Preferably, the optical element is monolithic. This makes manufacture and assembly faster and easier. For example, the optical element may be manufactured by injection molding.

Typically, the imaging surface is substantially planar.

Additionally or alternatively, the first and/or second and/or third (where applicable) TIR surface(s) is (are) substantially planar.

Where both the second TIR surface and the imaging surface are substantially planar, the plane of the second TIR surface is preferably substantially parallel to the plane of the imaging surface.

The shortest distance between the second TIR surface and the plane of the imaging surface may be any suitable distance. In one embodiment, the shortest distance between the second TIR surface and the plane of the imaging surface may be 5 mm. Alternatively, the shortest distance between the second TIR surface and the plane of the imaging surface may be 4 mm. Alternatively, the shortest distance between the second TIR surface and the plane of the imaging surface may be 3 mm.

Preferably, the laser is a VCSEL.

A second aspect of the disclosure provides a method of manufacturing an optical navigation device, the method comprising: providing a laser having a principal optical axis; providing an image sensor having an imaging surface; providing an optical element having an exposed user surface, a first total internal reflection (TIR) surface, and a second TIR surface on the underside of the exposed user surface, an angle between the principal optical axis of the laser and the first TIR surface being above 30° and below 40°; and together arranging the optical element, laser and image sensor to direct radiation emitted by the laser onto the imaging surface at least partly by total internal reflection by the first and second TIR surfaces.

A third aspect of the disclosure provides a mobile communications device comprising an optical navigation device comprising: a laser having a principal optical axis; an image sensor having an imaging surface; and an optical element having an exposed user surface, a first total internal reflection (TIR) surface, and a second TIR surface on the underside of the exposed user surface, wherein the optical element, laser and image sensor are together arranged to direct radiation emitted by the laser onto the imaging surface at least partly by total internal reflection by the first and second TIR surfaces, and wherein an angle between the principal optical axis of the laser and the first TIR surface is above 30° and below 40°.

A fourth aspect of the disclosure provides a method of operating an optical navigation device comprising: a laser having a principal optical axis; an image sensor having an imaging surface; and an optical element having an exposed user surface, a first total internal reflection (TIR) surface, and a second TIR surface on the underside of the exposed user surface, an angle between the principal optical axis of the laser and the first TIR surface being above 30° and below 40°, the method comprising: totally internally reflecting radiation emitted by the laser by the first and second TIR surfaces; illuminating at least part of the imaging surface with at least part of the radiation totally internally reflected by the first and second TIR surfaces; bringing an object into contact with the exposed user surface to frustrate total internal reflection of at least a portion of the laser radiation at the second TIR surface; and deriving user input information from changes in sequential image frames detected at the imaging surface.

The method according to the fourth aspect of the disclosure typically further comprises totally internally reflecting laser radiation by the first TIR surface onto the second TIR surface and totally internally reflecting laser radiation from the second TIR surface onto the imaging surface.

As indicated above, making the first and second surfaces TIR surface prevents the need to apply reflective coatings to the first or second surfaces, making manufacture quicker and less expensive.

As indicated above, the optical element preferably comprises a third TIR surface. In this case, an angle between the third TIR surface and a principal optical axis of the image sensor may be between 30° and 40°. Preferably, the laser radiation is totally internally reflected by the second TIR surface onto the imaging surface via total internal reflection by the third TIR surface.

A fifth aspect of the disclosure provides a method of manufacturing an optical navigation device, the method comprising: providing an optical element having an exposed user surface, a first total internal reflection (TIR) surface, and a second TIR surface on the underside of the exposed user surface; providing a laser; providing an image sensor having an imaging surface; calculating a required spot size in at least one dimension of the second TIR surface for illumination by radiation emitted by the laser; and configuring the laser, optical element and image sensor to direct radiation emitted by the laser onto the imaging surface at least partly by total internal reflection by the first and second TIR surfaces and to illuminate the second TIR surface with radiation emitted by the laser in accordance with the required spot size in said at least one dimension.

By manufacturing the optical navigation device in this way, a sufficiently large spot-size in said at least one dimension can be obtained on the exposed user surface, while achieving TIR from the first and second TIR surfaces. By using TIR, no reflective coatings need to be applied to the first and second TIR surfaces, thus making manufacture simpler, faster and less expensive.

Typically, the at least one dimension of the second TIR surface is the smallest dimension of the required spot-size since the laser beam may be stretched by different amounts in different dimensions as it propagates from the laser to the image sensor.

Typically, the step of configuring the laser and optical element comprises setting an angle between the first TIR surface of the optical element and a principal optical axis of the laser to a value above 30° and below 40°. As explained above, the inventors have realized that an angle of above 30° and below 40° between the principal optical axis of the laser and the first TIR surface is particularly advantageous.

BRIEF DESCRIPTION OF THE SEVERAL VIEWS OF THE DRAWINGS

An embodiment of the disclosure will now be described, by way of example only, with reference to the drawings, in which.

DETAILED DESCRIPTION

Figure 1:
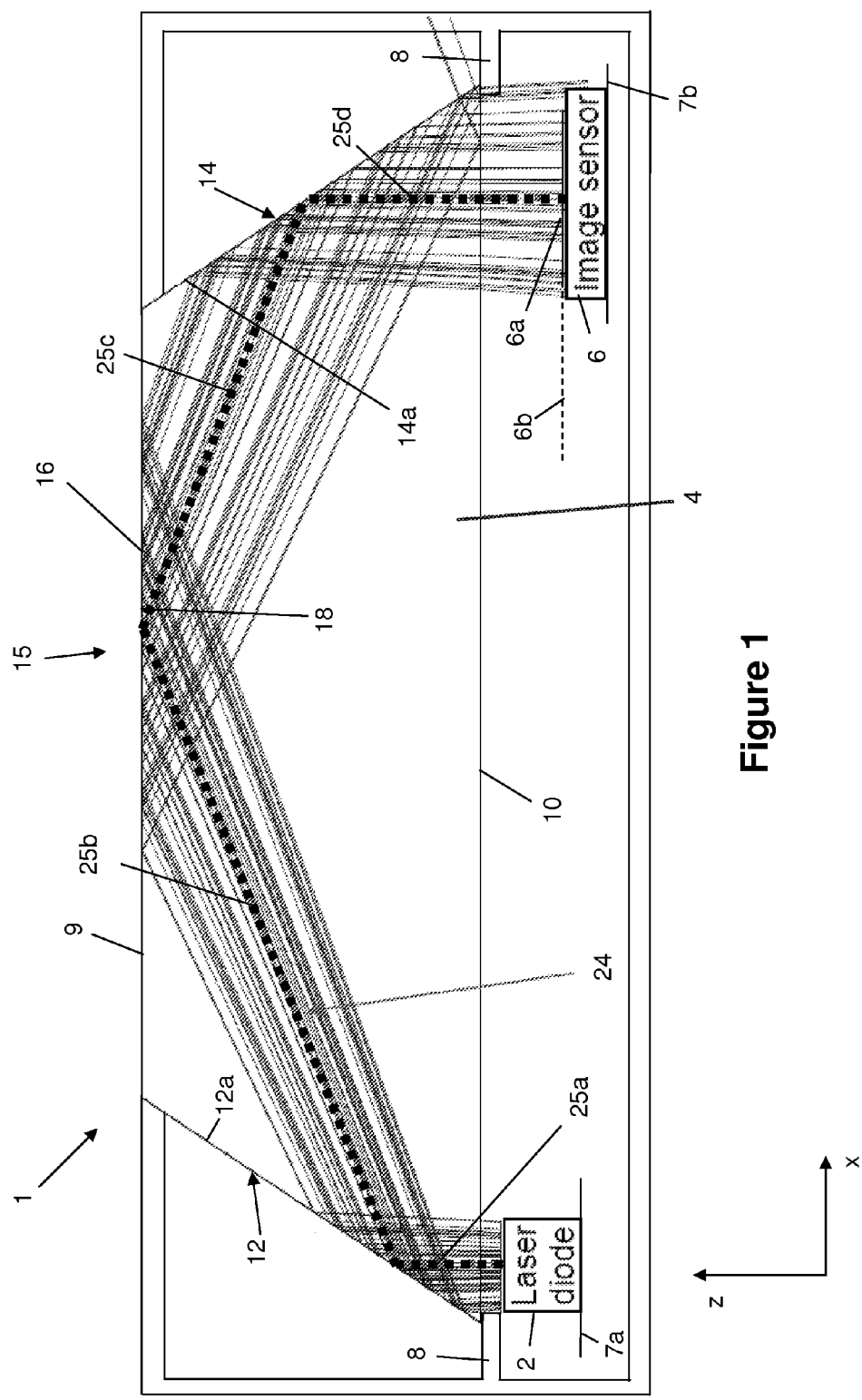
FIG. 1 is a schematic cross sectional view of an optical navigation device.

FIG. 1 is a schematic cross sectional view of an optical navigation device 1 comprising a laser diode 2 (typically a VCSEL but may be any other suitable type of laser diode), an optical element 4 and an image sensor 6 having a substantially planar imaging surface 6a lying on an imaging plane 6b. The laser diode 2 and image sensor 6 are mounted on separate circuit boards 7a, 7b, while the optical element 4 is suspended above the circuit boards 7a, 7b by a supportive housing 8. It will be understood that the laser 2 and image sensor 6 may alternatively be mounted on the same circuit board.

Figure 2:
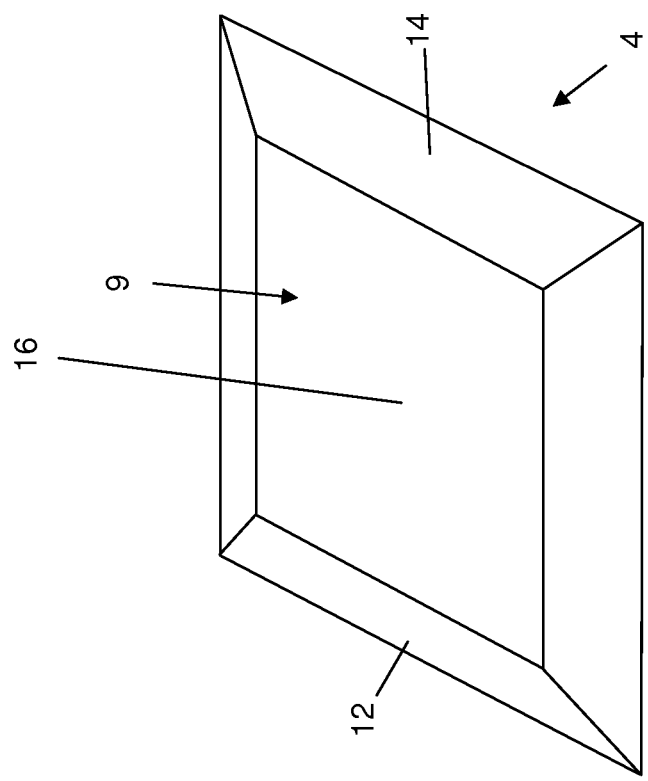
FIG. 2 is a schematic perspective view of the waveguide layer of the optical navigation device of FIG. 1.

As shown in FIGS. 1 and 2, the optical element 4 comprises an upper, user input face 9 and a lower face 10 with a pair of angled side faces 12, 14 extending between them, the side faces 12, 14 converging towards each other as they extend from the lower face 10 to the upper face 9. A touch sensitive input area 15 is formed at an intermediate region of the user input face 9 between the angled faces 12, 14. The input area 15 has a user input (or 'mousing') surface 16 which is exposed to the ambient environment as shown in FIG. 2.

The optical element 4 typically has a refractive index in the range 1.5-1.65 and may be formed for example from polycarbonate (refractive index approximately 1.59) or poly-methylmethacrylate (PMMA) (refractive index approximately 1.50).

The image sensor 6 comprises an array of pixels arranged to form the planar imaging surface 6a. In the present embodiment, the array comprises a 20×20 array of 30 µm CMOS pixels. However, it will be understood that other array sizes/ architectures may be employed and that any suitable alternative technology to CMOS (such as CCD) may be used in the pixels. The sensor further comprises a signal processor.

The internal surface (i.e., internal to the optical element 4) of angled side face 12 provides a first total internal reflection (TIR) surface 12a, while the underside (that is, the reverse side) of the exposed user surface 16 provides a second TIR surface 18. Typically, the internal surface (i.e., internal to the optical element 4) of angled side face 14 provides a third TIR surface 14a. Although TIR by the third surface 14a is not strictly necessary if, for example, a reflective coating is applied to it, manufacture of the optical navigation device is simpler and less expensive if such a coating can be avoided. As an alternative example, the image sensor may be moved to the location of the third surface 14a, in which case neither a reflective coating nor a third TIR surface is required. However, where the particular design requires three reflective surfaces, it is preferable (and it will be assumed below) that all three surfaces 12a, 14a, 18 are TIR surfaces.

Figure 3:
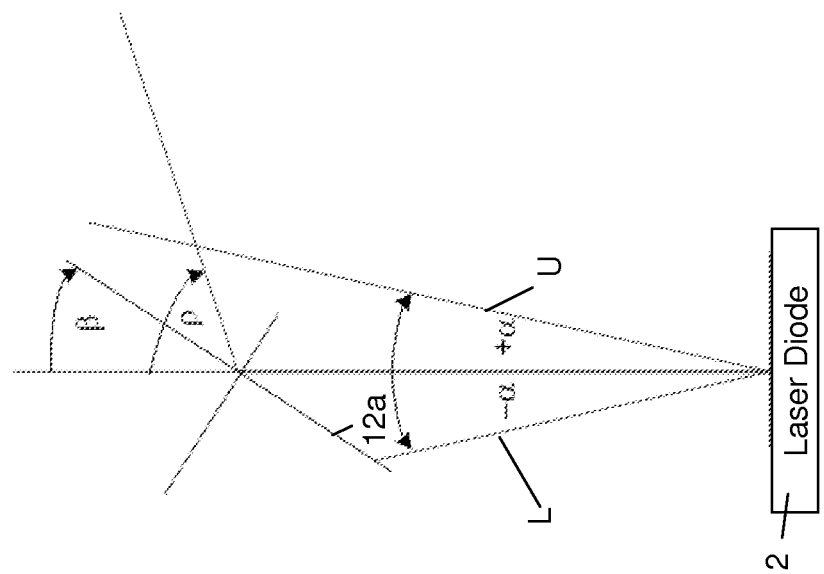
FIG. 3 provides a schematic sectional view of a portion of the device of FIG. 1 showing the divergence of the radiation beam emitted by the laser.

The laser 2, image sensor 6 and optical element 4 are together arranged such that, when radiation 24 is emitted by the laser 2, it enters the optical element 4 and is at least partly directed onto the imaging surface 6a of the image sensor 6 via the first, second and third TIR surfaces 12a, 18, 14a by total internal reflection. More specifically, radiation is emitted by the laser 2 towards the first TIR surface 12a of the optical element 4. The radiation beam emitted by the laser 2 increases in diameter about its principal optical axis as it propagates. A measure of the rate of increase in diameter of the laser beam is provided by the divergence angle, a, of the laser (more specifically, α is the beam divergence at the $1/e^2$ radius of the laser beam). Accordingly, the laser beam can be approximated to a lower marginal ray L and an upper marginal ray U being defined as the rays emitted by the laser 2 which diverge by the full divergence angle α. This is illustrated in FIG. 3.

The first TIR surface 12a directs the diverged radiation 24 towards the second TIR surface 18 by total internal reflection. This reflected radiation 24, which stretches in the x-direction (as defined in FIGS. 1, 4 and 6) as it propagates from the first TIR surface 12a towards the second TIR surface 18, is then totally internally reflected by the second TIR surface 18 towards the third TIR surface 14a. Finally, the third TIR surface 14a totally internally reflects the radiation 24 towards the imaging surface 6a, the radiation typically being compressed from its stretched state in the x-direction as it is reflected by the third TIR surface 14a.

The first and third TIR surfaces 12a, 14a are typically substantially planar. However, if required by the design configuration, the surface 12a may be curved in order to control divergence of the laser beam, thus helping to control the differential magnification of the laser beam incident on the second TIR surface 18. The third TIR surface 14a may also be curved, for example to help reduce the diameter of the laser beam incident on the imaging surface 6a.

The principal optical axis 25a of the laser 2, along with the relative arrangement of the TIR surfaces 12a, 14a, 18 and the imaging surface 6a, defines an on-axis optical path 25a, 25b, 25c, 25d from the laser 2 to the imaging surface 6a, the first portion of the on-axis optical path 25a typically being co-linear with the principal optical emission axis 25a of the laser 2. In addition, a principal optical axis of the image sensor 6a is typically co-linear with the portion 25d of the on-axis optical path between the third TIR surface 14a and the image sensor 6. That is, the portion 25d of the on-axis optical path between the third TIR surface 14a and the image sensor 6 is typically co-linear with the center of the field of view of the image sensor 6. This helps to maximize the amount of radiation detected by the image sensor 6.

Where the first and final portions 25a, 25d of the on-axis optical path are parallel, the circuit boards 7a, 7b on which the laser 2 and image sensor 6 are mounted may be co-planar or alternatively they may be located on separate parallel planes. When the laser 2 and image sensor are mounted on parallel or identical planes, the principal optical axis of the laser is typically parallel to that of the image sensor. In addition, the principal optical axis of the laser is typically perpendicular to the imaging plane 6b.

As shown in FIG. 1, the optical element 4 is arranged such that the radiation reflected by the third TIR surface 14a is not totally internally reflected by the lower face 10 of the optical element 4. Rather, the radiation passes through the lower face 10 onto the imaging surface 6a, thus causing substantially all of (or only some of, but preferably at least the majority of) the pixels of the pixel array to be illuminated.

It will be understood that the on-axis optical path 25a, 25b, 25c, 25d intersects the respective first, second and third TIR surfaces at an angle greater than the critical angle for total internal reflection. More preferably, both the lower and upper marginal rays L, U intersect the respective first, second and third TIR surface at an angle greater than the critical angle for total internal reflection.

Figure 4:
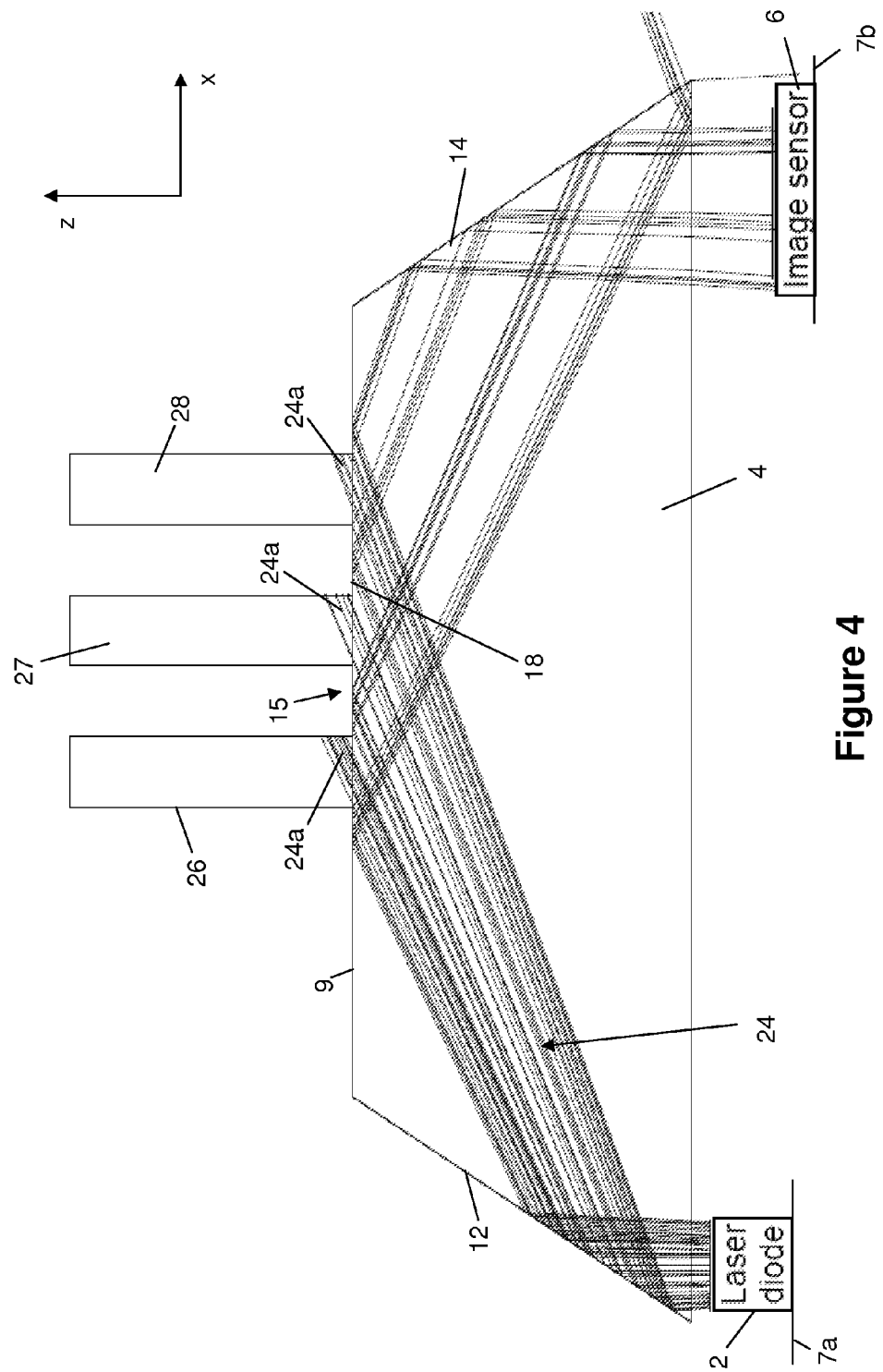
FIG. 4 is similar to FIG. 1 but further includes an object touching an exposed user surface of the device.

The critical angle ($\theta_c = \sin^{-1}(n2/n1)$) is dependent on the refractive index (n1) of the optical element 4 and the refractive index (n2) of the ambient air on the exposed user surface 16 (and on the exposed reverse sides of the first and third TIR surfaces 12a, 14a). However, as shown in FIG. 4, when an object—in this case a human digit such as a finger or a thumb—which has a larger refractive index than the ambient air touches the exposed user surface 16, the object (ridges 26-28 of the finger or thumb print) frustrate the total internal reflection (F-TIR) at the second TIR surface 18. That is, as shown in FIG. 4, the portion 24a of radiation 24 which is incident on the second TIR surface 18 directly beneath where the object contacts the exposed user surface 16 is no longer totally internally reflected and instead escapes from the optical element 4. This occurs because the increased refractive index (compared to that of the ambient air) of the object touching the exposed user surface 16 increases the critical angle for total internal reflection above the angle of incidence of the laser radiation beam. It will be understood that any suitable object may be used as an alternative to a human digit, such as a glove-covered human digit or a stylus. However, in the description below, it will be assumed that the object is a human digit.

Although not shown in FIG. 4, a portion (typically around 10%) of the escaped radiation 24a is scattered back into the optical element 4 from the interior of the digit towards the third TIR surface 14a and onto the imaging surface 6a. A portion of this scattered radiation is incident on the sensor surface 6a and can effectively be treated as noise. Thus the beam is interrupted on its path towards the third TIR surface 14a by the frustration of TIR by the digit and as a consequence dark areas appear on the sensor surface 6a. In addition, any radiation which does undergo TIR is directed onto the imaging surface 6a as before, thus producing areas of full illumination. The result is a modulated beam profile at the sensor surface 6a with areas of lower illumination corresponding to the feature ridges of the digit in contact with the exposed user surface 16. This causes an image pattern 30 to be formed on the imaging surface 6a.

Figure 5:
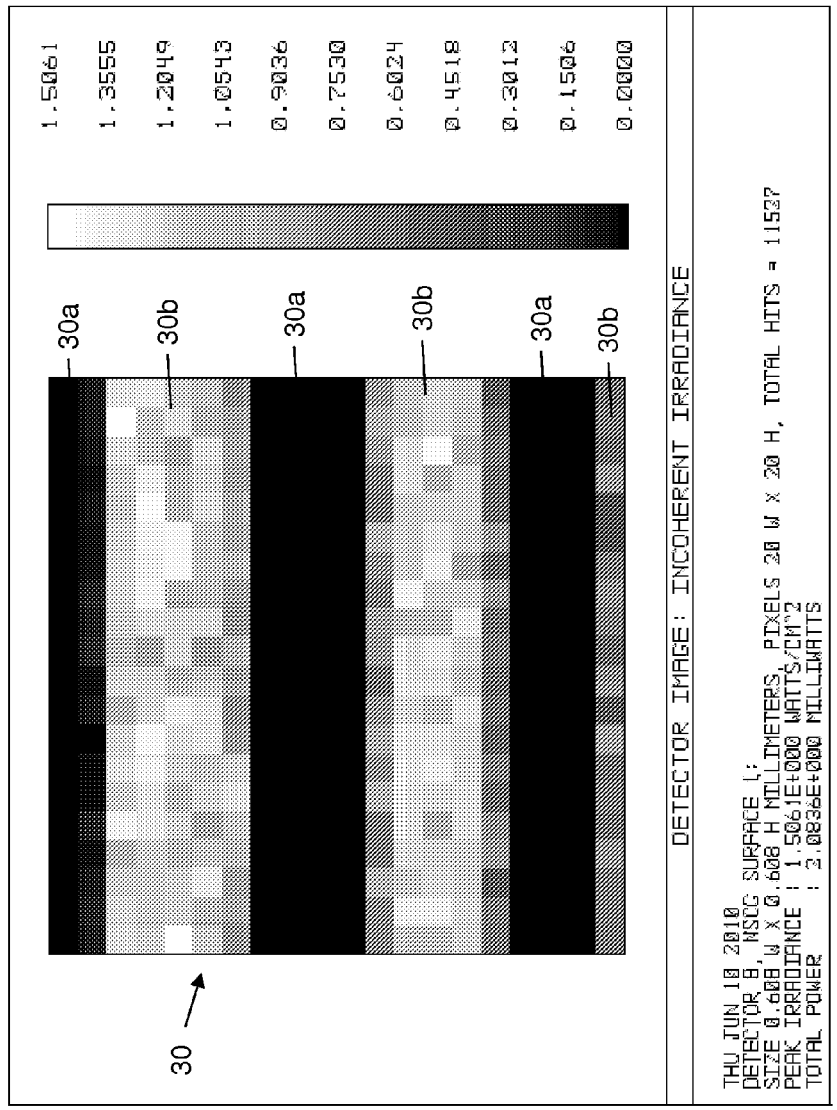
FIG. 5 shows an image pattern produced by the image sensor when an object touches the exposed user surface when the device is in use.

An exemplary image pattern is shown in FIG. 5. In this case, a 20×20 pixel array (which in total has a width of 0.608 mm and a height of 0.608 mm) is illuminated with a peak irradiance of 1.5 W/cm$^2$ and a total power of 2.1 mW. The frustrated total internal reflection (caused by the digit ridges touching the exposed user surface) at the second TIR surface 18 results in the detection of an image pattern comprising a series of dark and illuminated regions 30a, 30b.

The navigation device 1 is operated by sliding a digit 28 across the touch sensitive exposed user surface 16 and user input information is derived from changes in sequential image frames detected at the imaging surface 6a. In particular, as the digit 28 moves across the surface, the position of F-TIR on the exposed user surface changes and the image pattern formed on the imaging surface 6a changes accordingly. The signal processor of the sensor processes successive image patterns to identify the point or points of contact of the digit on the user input surface 16 and to determine motion vectors and the rate of movement of one or more features from one frame to the next. The motion vectors and rate of movement can then be translated into an appropriate control action for a mobile communications device or mobile computer (for example). The device may work at a frame rate of 1 kHz to 10 kHz in order to detect relative movement or movements of one or more features at the exposed user surface 16. The frame rate is set by the refresh rate of the sensor. The exposure may be achieved by a pulsating laser source or by sampling the sensor output at the required rate.

It may be possible to calibrate the sensor by determining the sensor illumination when the laser diode 2 is turned off and comparing this with the sensor illumination when the laser diode 2 is on. This calibration may occur at the start of each use of the optical navigation device or on a frame to frame basis.

As the radiation beam emitted by the laser 2 has low beam divergence (for a half angle measured at an intensity of 1/e$^2$, a maximum of circa 10° or less is typical), no collimation or imaging optics may be required. This allows the navigation device to be much thinner than conventional devices which use optics such as lenses and collimators. It also reduces part count and makes manufacture easier.

Designing the Optical Navigation Device

An overview of the design constraints of the optical navigation device 1 is provided below. However, a more comprehensive mathematical analysis is provided in Appendix 1.

The position and size of the touch sensitive input area 15 is defined by the area of the user input face 9 which is illuminated by the laser 2 (i.e., by the spot-size of laser radiation totally internally reflected by the second TIR surface 18). The desired size of the touch sensitive input area 15 may be dictated by a minimum number of features which the image sensor needs to detect in order to reliably detect motion of a digit over the exposed user surface 16. For example, the touch sensitive input area 15 may need to be large enough to capture 3 or 5 finger print ridges. For most applications, the touch sensitive input area 15 may need to be large enough to capture at least 2 finger print ridges.

This desired size of the touch sensitive input area 15, along with the requirement for TIR at the first, second and third TIR surfaces, thus imposes a primary design constraint on the optical navigation device. However, the size of the user input area 15 in the x-dimension is typically greater than the size of the user input area 15 in the y-dimension (i.e., the dimension perpendicular to the x and z dimensions shown in FIGS. 1, 4) due to the stretching of the beam in the x-dimension as it propagates from the first TIR surface 12a to the second TIR surface 18. As the optical navigation device must be capable of reliably detecting movement in all directions along the surface of the user input area for most applications, it is typically the y dimension of the surface area of the input area 15 which is considered to be a primary design constraint.

The maximum y-dimension (referred to below as "Spot_Y") of the touch sensitive input area 15 (in units of typical finger print ridge periods p) depends primarily on the divergent angle $\alpha'$ of the laser beam in the optical element 4 (which, using the small angle approximation, can be taken to equal the divergent angle $\alpha$ of the laser divided by the refractive index of the optical element 4), the aperturing constant A of the laser (see "Diffraction Loss Constraint" in Appendix 1), and the on-axis optical path length between the laser 2 and the second TIR surface 18 (the on-axis optical path length between the laser 2 and the second TIR surface 18 is referred to below as "Path"):

$$\text{Spot\_}Y/p{:}=2\cdot\text{Path}\cdot\tan(A\cdot\alpha')/p. \quad (I)$$

Figure 6:
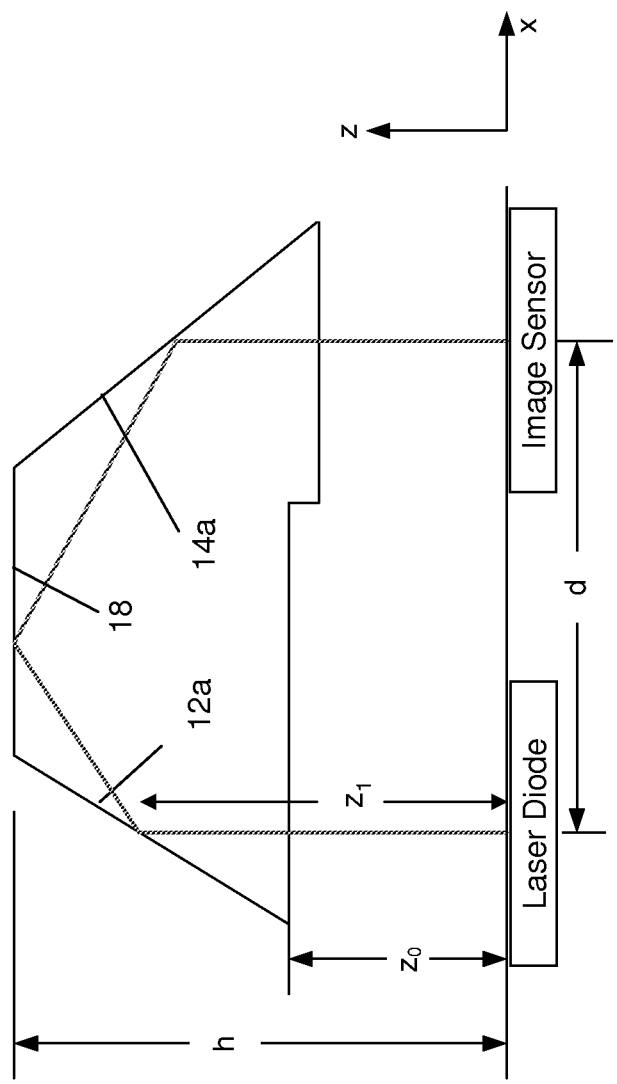
FIG. 6 is a simplified version of the diagram of FIG. 1, omitting the lower and upper marginal rays.

The on-axis optical path between the laser 2 and the second TIR surface 18 is dependent on the angle $\beta_1$ between the principal optical axis 25a of the laser 2 and the first TIR surface 12a along with the z-dimensions of the device (see FIG. 6). A full explanation of equation I is provided in Appendix 1.

The optical navigation device may thus be manufactured by calculating a required spot size in the y-dimension of the second TIR surface 18; and configuring the laser, optical element and image sensor to direct radiation emitted by the laser onto the imaging surface at least partly by total internal reflection by the first TIR surface 12a and the second TIR surface 18, and to illuminate the second TIR surface 18 with radiation emitted by the laser 2 in accordance with the required spot size in the y dimension. Typically the configuring step will comprise setting the angle $\beta_1$. Where the principal optical axes of the laser and the image sensor are parallel, $\beta_1$ may be set indirectly by setting the angle between the plane of the first TIR surface 12a and the imaging plane (which equals $90°-\beta_1$.

One solution may be to set $\beta_1$ to 30° in order to achieve three identical angles of reflection of 60° at each of the three TIR surfaces 12a, 14a, 18. Alternatively, by setting $\beta_1$ to be much higher than 30°, it may be thought that a large y-dimension (Spot_Y) can be achieved with a relatively low device height (device height, h, being defined as the shortest distance between the laser 2 and the plane of the second TIR surface 18—see FIG. 6). However, the inventors have realized that setting $\beta_1$ above 30° and below 40° is particularly advantageous. Such an angle allows a relatively low device height to be achieved (e.g., 5 mm or below), which is particularly advantageous for navigation devices used in for example mobile communications devices, using an off-the-shelf (and therefore relatively inexpensive) VCSEL laser 2 and an optical element 4 having a refractive index which can be manufactured with readily available, inexpensive materials (such as polycarbonate). In addition, reflective coatings need not be applied to any of the surfaces to make them reflective, since the principles of TIR can be employed at these angles.

Figure 7:
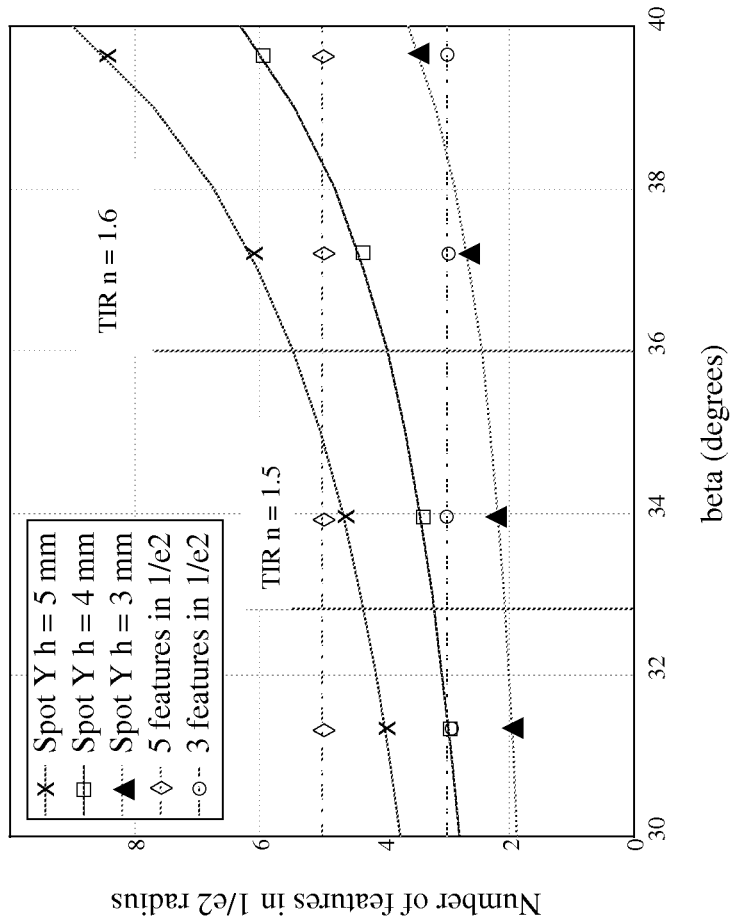
FIG. 7 plots the y-dimension of the user input area of the device of FIGS. 1 to 6 against the angle between the principal optical axis of the laser and the first TIR surface for three different device heights.

To illustrate the particular benefits of this range, FIG. 7 plots the y-dimension (Spot_Y) of the touch sensitive user input area 15 (in units of finger print ridge features as per equation I above) as a function of the angle $\beta_1$ for three different designs of the optical navigation device 1. In each design, the same VCSEL source is employed, having a divergence, a, measured from its optical axis at $1/e^2$ of its peak intensity of approximately 10°. An aperturing constant A may be applied to allow for the combination of dynamic range of the sensor and the illumination profile, or to prevent (or reduce) diffractive ripples appearing in the far field of the beam at the sensor. For the purposes of calculating the number of features in the beam plotted in FIG. 7, a value of A=1 is applied. In the first (upper) plot, the device height is set to 5 mm; in the second (middle) plot, the height is set to 4 mm; and in the third (lower) plot, the height is set to 3 mm.

Vertical lines 40, 42 indicate the maximum angle, $\beta_1$, which can be employed to achieve TIR at the first TIR surface 12a when the refractive index, n, of the optical element 4 is 1.5 and 1.6 respectively. Horizontal lines 44, 46 highlight the points at which the y-dimension of the user input area 15 allows three and five finger print feature periods to be captured respectively.

The allowed designs, for a given refractive index and a required y-dimension in finger print feature periods, occupy the space above the horizontal y-dimension line 44, 46 and to the left of the vertical maximum angle line 40, 42. Several particularly advantageous solutions for $\beta_1$ can be found in the sub-range 32.5° to 37.5°. For example, for an optical element with a refractive index of 1.6 and a required minimum y-dimension of 5 finger print ridge periods, the angle $\beta_1$ must be between 35° and 36° for a device height of 5 mm. This is a particularly desirable solution for some applications. In addition, for an optical element with a refractive index of 1.6, a device height of 5 mm and a required minimum y-dimension of 4 finger print ridge periods, desirable values of $\beta_1$ again fall within the 32.5° to 37.5° range. Alternatively, for an optical element with a refractive index of 1.6 and a required minimum y-dimension of 4 finger print ridge periods, the angle $\beta_1$ should be between 31° and 36° for a device height of 5 mm. Similarly for an optical element 4 with a refractive index of 1.5 and a required minimum y-dimension of 3 finger print ridge periods, the angle $\beta_1$ should be between 31.5° and 32.8° for a device height of 4 mm. In all of these sub-ranges, the trade-off between the refractive index of the optical element 4, y-dimension of the input area 15 and device height h is particularly optimized.

It can also be extrapolated from FIG. 7 that, if the optical element 4 is provided with a refractive index above 1.6, more finger print ridge periods could be captured in the y-dimension of the user input area 15 by increasing the angle $\beta_1$. Additionally or alternatively, a higher refractive index of the optical element 4 decreases the minimum height required by the device for TIR to be achieved at the first TIR surface 12a (which, as mentioned above, has particular benefits in, for example, mobile communication devices where miniaturization is a key design driver). However, it can be undesirable to increase the refractive index beyond approximately 1.65 as the cost of materials becomes prohibitively expensive.

It is noted, for completeness, that the preferred $\beta_1$ range of above 30° and below 40° holds, even if the value of the refractive index of the optical element 4 is increased to 1.65.

Thus, to achieve values of $\beta_1$ above 40°, it may be necessary to employ an optical element 4 having a refractive index of much greater than 1.65 which would be prohibitively expensive. For values of $\beta_1$ below 30°, it may not be possible to achieve a sufficient y-dimension (Spot_Y) for the user input area 15 for a required device height, h.

Where the laser 2 and image sensor 6 are co-planar, or are provided on parallel planes, it is preferable that an angle between the principal optical axis of the image sensor 6 and the third TIR surface 14a of the optical element 4 is substantially equal to the angle $\beta_1$ between the principal optical axis 25a of the laser 2 and the first TIR surface 12a. However, the angle between the principal optical axis of the image sensor 6 and the third TIR surface 14a of the optical element 4 may be any suitable angle for achieving TIR. For example, the angle between the principal optical axis of the image sensor 6 and the third TIR surface 14a may be designed to compensate for geometric distortion effects generated by the first and/or second TIR surfaces 12a, 18.

Figure 8:
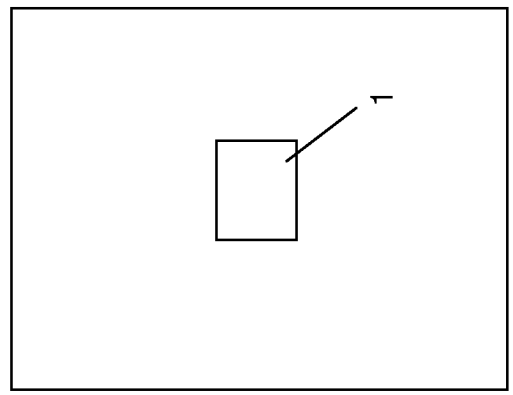
FIG. 8 shows a mobile communications device comprising the optical navigation device of FIGS. 1 to 6.
Figure 8:

FIG. 8 shows a mobile communications device 50 comprising the optical navigation device 1 described above.

While this detailed description has set forth some embodiments of the present disclosure, the appended claims cover other embodiments of the present disclosure which may differ from the described embodiments according to various modifications and improvements.

APPENDIX 1

Design Constraints

The primary design constraints on the optical navigation device can be summed up as follows:

The laser radiation must be totally internally reflected by the first and second (and preferably third) TIR surfaces (see under "TIR constraint" heading below);

Diffraction loss/signal interference from beam truncation is limited (See under "Diffraction loss constraint" heading below); and The user input area 15 is of sufficient size for the image sensor to reliably detect movement of a digit (or other feature) over the area 15 (see "Feature pick-up constraint" heading below).

Each of these constraints are considered in turn below.

TIR Constraint

Figure 9:
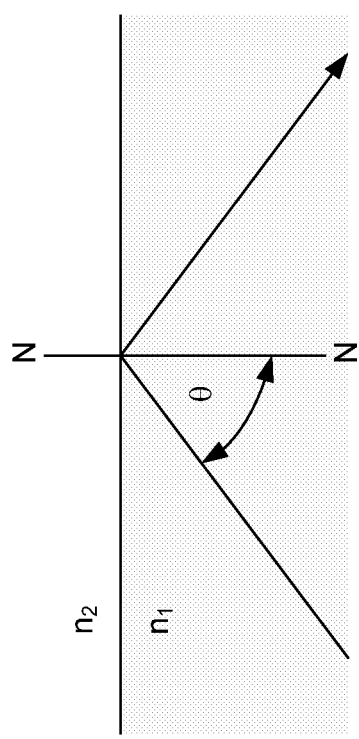
FIG. 9 illustrates the critical angle for total internal reflection.

For total internal reflection to occur, the angle $\theta$ (see FIG. 9) between the respective incident rays and the normal to the respective TIR surfaces must comply with the expression $$\sin\theta > \frac{n_2}{n_1}, \qquad (1)$$

where $n_1$ is the refractive index of the optical element 4 and $n_2$ is that of the material on the other side of the interface. As the material on the other side of the interface to the optical element 4 is typically air, $n_2$ will be assumed to be unity.

$n_1$ will be referred to simply as n in the derivation below, since it is being assumed that $n_2$ is unity.

Diffraction Loss Constraint

Aperturing a coherent laser beam causes not only energy loss but also an interference effect whereby ripples start to appear in the laser beam's transverse profile. The radiation beam output from the laser can be considered to be Gaussian, having intensity:

$$I(r) = I_0 \cdot \exp\left[-2\frac{r^2}{w^2}\right] \qquad (2)$$

where:

$I_0$ is the maximum radiation beam intensity;

r is the radial distance from the optical axis of the beam; and w is the $1/e^2$ radius of the laser radiation beam.

For a reduction in on-axis intensity of 1% in the far field and an insignificant near field ripple it has been found that a circular aperture of diameter >4.6 w is required. The ripple is a diffraction effect whereby the diffraction pattern from the edge of the aperture propagates in to the laser beam profile to modulate the intensity profile. This should not be confused with the 99% aperture power transmission condition which is met when the aperture diameter is >πw.

It is convenient to re-express the Gaussian intensity equation (1) in terms of angles and the trigonometric small angle approximation:

$$I(r) = I_0 \cdot \exp\left[-2\frac{\tan^2\theta}{\tan^2\alpha}\right] \cong I_0 \cdot \exp\left[-2\frac{\theta^2}{\alpha^2}\right] \qquad (3)$$

where $\theta$ is the angle from the principal optical axis; and $\alpha$ is the divergent angle of the laser output.

Although this expression is not completely accurate for the near field case, it is a good enough approximation in the far field.

If $\alpha=10°$, it would not be unreasonable to set the aperturing condition for optical surfaces in the design to be $A\alpha=2.3\alpha=23°$ as this would give <1% diffractive ripple on axis. Therefore, A will be taken as 2.3 in the calculations for the dimensions of TIR surfaces below. However, when looking at the Spot_Y dimension, the aperturing constant is set to A=1.

Feature Pick-Up Constraint

The finger print ridge period for humans, P, is typically in the range 0.25 to 0.7 mm (assumed to be 0.5 mm in derivation below). To obtain a reliable signal from a moving finger on the exposed user surface, the spot-size of the laser radiation totally internally reflected by the second TIR surface 18 must be large enough to image a certain number N of ridges. N will typically be dependent on the application for which the navigation device is being used but must be at least 2 for most applications. Thus the laser beam's minimum dimension on the second TIR surface 18 may be taken as:

$$w > \frac{1}{2} \cdot N \cdot P \qquad (4)$$

where:

w is the $1/e^2$ radius of the beam, which varies with the angle it makes to the plane of the mirrors' reflection.

These constraints affect the design of the optical navigation device as explained below.

For simplicity, the lower surface 10 of the optical element can be removed from the calculations below by using the small angle approximation to obtain:

$$z_{1o} = z_1 - (1-n) \cdot z_0 \quad (5a)$$

$$\alpha' = \frac{\alpha}{n} \quad (5b)$$

where:
- n is the refractive index of the optical element 4;
- $z_1$ is the shortest distance along the on-axis optical path between the laser and the first TIR surface 12a (see FIG. 6);
- $z_0$ is the shortest distance between the laser and the lower surface 10 of the optical element 4 (see FIG. 6); and
- α is the divergence angle of the laser (see FIG. 3).

The required size of the first TIR surface 12a is dictated by the beam divergence α, the aperturing condition of the laser and the TIR condition. The distance $z_1$, although seemingly dependent on these parameters, may typically be driven more by the minimum required y-dimension (Spot_Y) of the touch sensitive input area 15. It is noted that the maximum on-axis optical path length, and therefore the maximum size of the touch sensitive input area 15 (due to divergence of the laser beam), is achieved when the angle of incidence of the laser beam at the first TIR surface is equal to the critical angle for TIR.

The line of the first TIR surface 12a in the z dimension as a function of x may be expressed as:

$$Z_1 = \frac{x}{\tan\beta_1} + z_1$$

where
x is the x co-ordinate and the other parameters being as defined above.

The line of the lower marginal ray L in the z dimension as a function of x may be expressed as:

$$Z_{1L}(x, \alpha', z_{1o}, A) := \frac{x}{\tan(-A \cdot \alpha')} + z_{1o}.$$

The line of the upper marginal ray U in the z dimension as a function of x may be expressed as:

$$Z_{1U}(x, \alpha', z_{1o}, A) := \frac{x}{\tan(A \cdot \alpha')} + z_{1o}.$$

From these equations, the x co-ordinates of the required extent of the first TIR surface 12a can be found as follows:

$$X_{1xL} = (z_{1o} - z_1)\left(\frac{1}{\tan\beta_1} - \frac{1}{\tan(-A \cdot \alpha')}\right)^{-1}$$

and $$X_{1xU} = (z_{1o} - z_1)\left(\frac{1}{\tan\beta_1} - \frac{1}{\tan(-A \cdot \alpha')}\right)^{-1}.$$

These co-ordinates dictate the required size of the first TIR surface 12a in the x-dimension.

The following expressions define the angles between the respective reflected on-axis, upper and lower marginal rays U, L and the principal optical axis of the laser 2 as they are totally internally reflected by the first TIR surface 12a:

$$\rho_{1o} = 2 \cdot \beta_1$$

$$\rho_{1L} = 2 \cdot \beta_1 + A \cdot \alpha'$$

$$\rho_{1U} = 2 \cdot \beta_1 - A \cdot \alpha'.$$

The points of intersection in the z dimension of the lower and upper marginal rays L, U with the second TIR surface 18 can be calculated from the following expressions:

$$C_{1L} = Z_{1L}(X_{1xL}, \alpha', z_{1o}, A) - \frac{X_{1xL}}{\tan\rho_{1L}}$$

$$C_{1U} = Z_{1U}(X_{1xU}, \alpha', z_{1o}, A) - \frac{X_{1xU}}{\tan\rho_{1U}}.$$

The x co-ordinates for the points of intersection of the on-axis optical path and the lower and upper marginal rays with the second TIR surface (and thus the size of the input area 15 in the x-dimension) can be determined as follows:

$$X_{2o} = (h - z_1) \cdot \tan\rho_{1o}$$

$$X_{2L} = (h - C_{1L}) \cdot \tan\rho_{1L}$$

$$X_{2U} = (h - C_{1U}) \cdot \tan\rho_{1U}.$$

In order to achieve TIR for the entire laser beam between the lower and upper marginal rays, the TIR condition for the lower marginal ray L must be considered as it makes the smallest angle of incidence with the first TIR surface. This condition can be expressed as:

$$TIR(\alpha', \beta_1, n) := \begin{vmatrix} 1 & \text{if } \left(\frac{\pi}{2} - \beta_1\right) > \left(a\sin\left(\frac{1}{n}\right) + A \cdot \alpha'\right) \\ 0 & \text{otherwise} \end{vmatrix}$$

giving a required angle $\beta_1$ between the laser principal optical axis and the first TIR surface 12a as:

$$\beta_{tir} = \left(\frac{\pi}{2} - \sin^{-1}\left(\frac{1}{n}\right)\right) - A \cdot \alpha'.$$

The on-axis optical path between the laser 2 and the second TIR surface 18 can be expressed as:

$$\text{Path} = z_1 + \sqrt{(h-z_1)^2 + X_{2o}^2}.$$

The diameter of the laser-illuminated region of the second TIR surface 18 (i.e., of the input area 15) in the x dimension can be expressed as:

$$\text{Spot\_}X = X_{2L} - X_{2U}$$

while the diameter of the laser-illuminated region of the second TIR surface 18 (i.e., of the input area 15) in the y dimension can be expressed as:

$$\text{Spot\_}Y = 2 \cdot \text{Path} \cdot \tan(A \cdot \alpha').$$

The plots shown in FIG. 7 are derived from this equation for Spot_Y as a function of $\beta_1$. The y-axis of FIG. 7 being Spot_Y/p (p=0.5 mm, the period between successive finger ridges) and the x-axis of FIG. 7 being $\beta_1$. Different plots are provided for different values of h (3 mm, 4 mm and 5 mm). The z-dimension $z_1$ is taken to be 2 mm in each case, while the value of $\alpha$ is taken as 10° and A is taken as 1.

Figure 10:
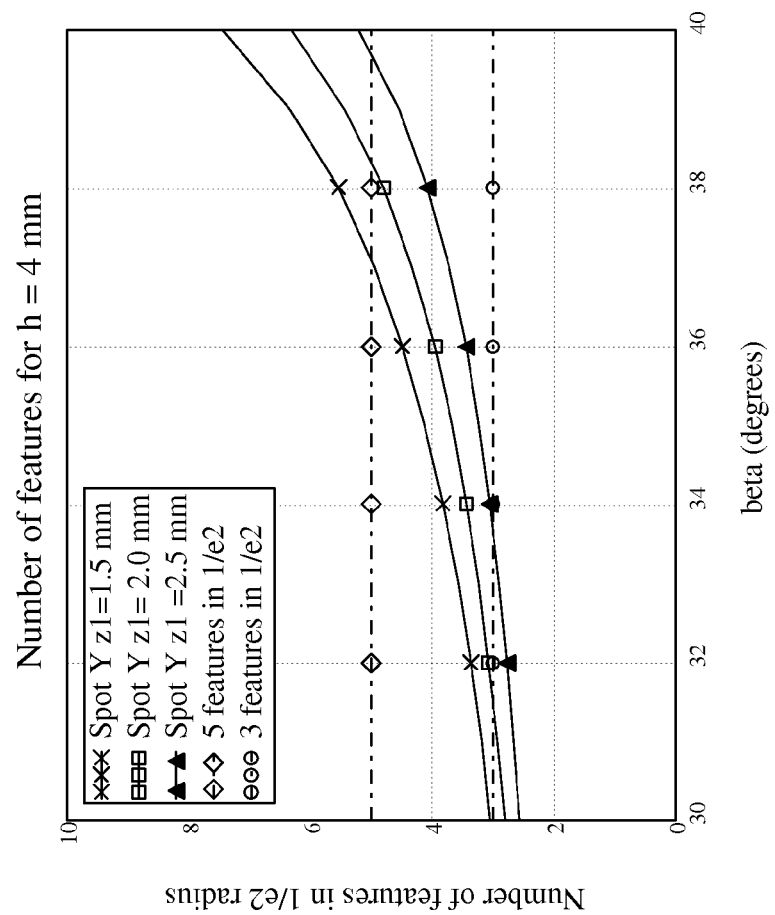
FIG. 10 plots the y-dimension of the user input area of the device of FIGS. 1 to 6 against the angle between the principal optical axis of the laser and the first TIR surface for three different $z_1$ values and a given device height of 4 mm.

FIG. 10 illustrates the effect of $z_1$ on the y-dimension (Spot_Y) of the input area 15, again expressed in units of finger print ridge periods. In the first (upper) plot, $z_1$ is set to 1.5 mm; in the second (middle) plot, $z_1$ is set to 2 mm; and in the third (lower) plot, $z_1$ is set to 2.5 mm. In each case, the device height, h, is kept constant at 4 mm. As $z_1$ increases, the number of finger print ridge features captured in the y-dimension decreases. This is because the overall on-axis path length decreases with increasing $z_1$ for a given height, h, resulting in less divergence of the laser light in the y-dimension.

The various parameters can thus be selected to design the optical navigation device for a particular set of conditions, the driving considerations typically being the minimum dimension of the input area 15 and the TIR conditions. As described above, a particularly advantageous range of $\beta_1$ values for the design can be found at above 30° and below 40°.

The invention claimed is:

1. An optical navigation device comprising:
   a laser having a principal optical axis;
   an image sensor having an imaging surface; and
   an optical element having an exposed user surface, a first total internal reflection (TIR) surface, a second TIR surface on an underside of the exposed user surface and a third TIR surface, wherein the optical element, laser and image sensor are together arranged to direct radiation emitted by the laser onto the imaging surface at least partly by total internal reflection by the first, second and third TIR surfaces and without use of a lens, and wherein an angle between the principal optical axis of the laser and the first TIR surface is above 30° and below 40°.

2. The optical navigation device of claim 1 wherein an angle between a principal optical axis of the image sensor and the third TIR surface is above 30° and below 40°.

3. The optical navigation device of claim 1 wherein the angle between the first TIR surface and the principal optical axis of the laser is between 32.5° and 37.5°.

4. The optical navigation device of claim 1, wherein an angle between the principal optical axis of the image sensor and the third TIR surface is between 32.5° and 37.5°.

5. The optical navigation device of claim 1 wherein the optical element comprises a material having a refractive index of between 1.4 and 1.65.

6. The optical navigation device of claim 1 wherein at least one of the first and second TIR surfaces is an internal surface of the optical element.

7. The optical navigation device of claim 1, wherein the third TIR surface is an internal surface of the optical element.

8. The optical navigation device of claim 1 wherein the optical element is monolithic.

9. The optical navigation device of claim 1 wherein the imaging surface is substantially planar.

10. The optical navigation device of claim 1 wherein at least one of the first, second and third TIR surfaces is substantially planar.

11. The optical navigation device of claim 10 wherein the second TIR surface and the imaging surface are substantially planar and a plane of the second TIR surface is substantially parallel to a plane of the imaging surface.

12. The optical navigation device of claim 11, wherein the shortest distance between the second TIR surface and the plane of the imaging surface is 5 mm.

13. A method of manufacturing an optical navigation device, the method comprising:
   arranging a laser, having a principal optical axis, to emit radiation toward an optical element having an exposed user surface, a first total internal reflection (TIR) surface, a second TIR surface on an underside of the exposed user surface, a third TIR surface, an angle between the principal optical axis of the laser and the first TIR surface being above 30° and below 40°; and
   arranging an image sensor, having an imaging surface, adjacent to the optical element, wherein
   arranging the laser and the image sensor includes arranging the optical element, laser and image sensor to direct the radiation emitted by the laser onto the imaging surface at least partly by total internal reflection by the first, second and third TIR surfaces and without use of a lens.

14. The method of claim 13, wherein the second TIR surface and the imaging surface are substantially planar and arranging the image sensor includes arranging the second TIR surface to be substantially parallel to the imaging surface.

15. A mobile communications device comprising:
   an optical navigation device that includes:
   a laser having a principal optical axis;
   an image sensor having an imaging surface; and
   an optical element having an exposed user surface, a first total internal reflection (TIR) surface, a second TIR surface on an underside of the exposed user surface, and a third TIR surface, wherein the optical element, laser and image sensor are together arranged to direct radiation emitted by the laser onto the imaging surface at least partly by total internal reflection by the first, second and third TIR surfaces and without use of a lens, and wherein an angle between the principal optical axis of the laser and the first TIR surface is above 30° and below 40°.

16. A method, comprising:
   operating an optical navigation device including a laser having a principal optical axis; an image sensor having an imaging surface; and an optical element having an exposed user surface, a first total internal reflection (TIR) surface, a second TIR surface on an underside of the exposed user surface, and a third TIR surface, an angle between the principal optical axis of the laser and the first TIR surface being above 30° and below 40°, the operating including:
   totally internally reflecting radiation emitted by the laser by the first, second and third TIR surfaces without use of a lens;
   illuminating at least part of the imaging surface with at least part of the radiation totally internally reflected by the first, second and third TIR surfaces;
   bringing an object into contact with the exposed user surface to frustrate total internal reflection of at least a portion of the laser radiation at the second TIR surface; and
   deriving user input information from changes in sequential image frames detected at the imaging surface.

17. The method of claim 16, wherein the operating includes totally internally reflecting laser radiation by the first TIR surface onto the second TIR surface and totally internally reflecting laser radiation from the third TIR surface onto the imaging surface.

18. The method of claim 16 wherein an angle between the third TIR surface and a principal optical axis of the image sensor is between 30° and 40°.

19. The method of claim 16 wherein the laser radiation is totally internally reflected by the second TIR surface onto the imaging surface via total internal reflection by the third TIR surface.

* * * * *